United States Patent
Yamada

(10) Patent No.: US 8,975,904 B2
(45) Date of Patent: Mar. 10, 2015

(54) WAFER INSPECTION INTERFACE AND WAFER INSPECTION APPARATUS

(75) Inventor: Hiroshi Yamada, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 232 days.

(21) Appl. No.: 13/230,161

(22) Filed: Sep. 12, 2011

(65) Prior Publication Data

US 2012/0062258 A1   Mar. 15, 2012

(30) Foreign Application Priority Data

Sep. 15, 2010   (JP) ................................. 2010-207224

(51) Int. Cl.
  *G01R 31/00*   (2006.01)
  *G01R 31/28*   (2006.01)

(52) U.S. Cl.
  CPC ........ *G01R 31/2887* (2013.01); *G01R 31/2891* (2013.01); *G01R 31/2893* (2013.01)
  USPC .............. 324/750.16; 324/750.2; 324/756.03; 324/757.01

(58) Field of Classification Search
  USPC ............. 324/750.16, 750.24, 754.07, 756.01, 324/756.03, 757.01, 757.03
  See application file for complete search history.

(56) References Cited

U.S. PATENT DOCUMENTS

| | | | |
|---|---|---|---|
| 6,169,409 B1 * | 1/2001 | Amemiya | 324/750.08 |
| 6,540,014 B2 * | 4/2003 | Getchel et al. | 165/80.1 |
| 6,771,090 B2 * | 8/2004 | Harris et al. | 324/756.02 |
| 6,885,206 B2 * | 4/2005 | Halley | 324/756.01 |
| 2002/0190740 A1 * | 12/2002 | Ishizaka et al. | 324/761 |
| 2004/0155671 A1 | 8/2004 | Halley | |
| 2008/0174326 A1 * | 7/2008 | Jeon et al. | 324/754 |
| 2008/0297186 A1 * | 12/2008 | Chong et al. | 324/754 |
| 2009/0058446 A1 * | 3/2009 | Yamamoto et al. | 324/760 |
| 2009/0101816 A1 * | 4/2009 | Noji et al. | 250/310 |
| 2009/0237089 A1 * | 9/2009 | Cho et al. | 324/555 |

FOREIGN PATENT DOCUMENTS

| | | |
|---|---|---|
| JP | 11-186349 A | 7/1999 |
| WO | 2010092672 A1 | 8/2010 |

\* cited by examiner

*Primary Examiner* — Huy Q Phan
*Assistant Examiner* — Dustin Dickinson
(74) *Attorney, Agent, or Firm* — Nath, Goldberg & Meyer; Jerald L. Meyer

(57) ABSTRACT

A wafer inspection interface IF comprises a probe card, an adsorption unit configured to adsorb a wafer to the probe card, a wafer adsorption sealing member to which the probe card is adsorbed, and a fixing ring configured to fix the wafer adsorption sealing member to a card holder. The adsorption unit includes an air exhaustion unit, a first air duct whose right end portion is opened in the hermetically closed space and the left end portion is opened at a side of the fixing ring, a second air duct whose right end portion is opened to face an opening of the left end portion of the first air duct and the left end portion is opened to be connected with the air exhaustion unit, and a hole by which the first air duct is in communication with the second air duct.

11 Claims, 13 Drawing Sheets

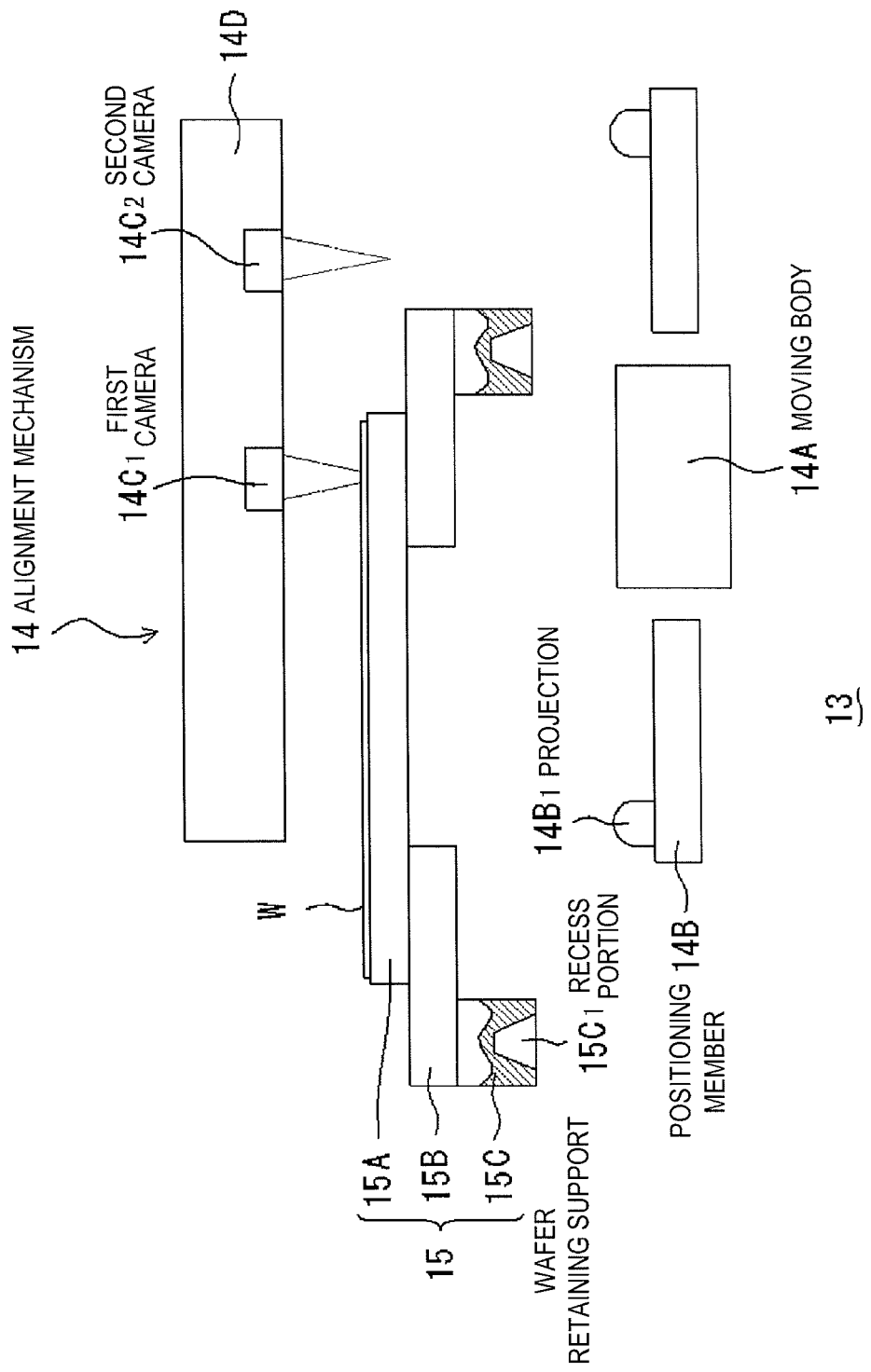

WAFER INSPECTION INTERFACE AND WAFER INSPECTION APPARATUS

CROSS-REFERENCE TO RELATED APPLICATIONS

This application claims the benefit of Japanese Patent Application No. 2010-207224, filed on Sep. 15, 2010, in the Japan Patent Office, the disclosure of which is incorporated herein in their entirety by reference.

TECHNICAL FIELD

The present disclosure relates to a wafer inspection interface and a wafer inspection apparatus, and in particular, a wafer inspection interface and a wafer inspection apparatus to reduce costs through space saving.

BACKGROUND

A wafer inspection apparatus includes, for example, a probe apparatus for performing electrical characteristics inspection of a wafer on a plurality of devices, a burn-in inspection apparatus for performing an acceleration inspection of a wafer, and the like.

The probe apparatus generally includes a loader chamber for transferring a wafer and an inspection chamber for inspecting electrical characteristics of the wafer, in which the electrical characteristics of the wafer are inspected by controlling various devices within the loader chamber and the inspection chamber through a control device. The loader chamber includes a cassette loading unit for loading wafers by cassette, a wafer transfer mechanism transferring a wafer between a cassette and the inspection chamber, and a pre-alignment mechanism performing pre-alignment of the wafer while the wafer transfer mechanism transfers the wafer. The inspection chamber includes a loading table for loading the wafer thereon from the loader chamber and moving the wafer in X, Y, Z, and θ directions, a probe card disposed at an upper side of the loading table, and an alignment mechanism for performing alignment of a plurality of probes of the probe card and a plurality of electrodes of the wafer in cooperation with the loading table. After the loading table and the alignment mechanism align the wafer and the probe card in cooperation, electrical characteristics of the wafer are inspected.

Also, in the case of a burn-in inspection apparatus, there is known a conventional technique that a plurality of electrodes of a wafer retained and supported by a wafer tray and a plurality of bumps of a probe sheet are aligned, and the wafer tray, the wafer, the probe sheet, and the like are integrated through vacuum adsorption so as to be assembled as a sheet of a card. Then, the card is transferred to be mounted in a burn-in unit, and the wafer acceleration inspection is performed at a certain high temperature within the burn-in unit.

However, the conventional probe apparatus has the following problems. For example, in order to align the plurality of electrodes of the wafer and the plurality of probes of the probe card by using a camera of the alignment mechanism while moving the loading table in the XY direction, a space for moving the loading table and a space for moving the camera of the alignment mechanism are required. Thus, the inspection chamber itself, which is a major part of the probe apparatus, occupies a considerably large space in three dimensions. Also, the loader chamber requires a space for transferring the wafer from the cassette to the inspection chamber. Thus, when a plurality of probe apparatuses are installed depending on device production capabilities, a plurality of conventional probe apparatuses are unavoidably arranged on a plane, increasing an installation space and incurring a high cost. Also, the burn-in apparatus requires an independent wafer transfer mechanism or a device for integrating the card in order to vacuum-adsorb the wafer and the probe sheet, and the like to integrate them, apart from the burn-in unit.

SUMMARY

The present disclosure provides some embodiments of a wafer inspection interface and a wafer inspection apparatus capable of using an inspection chamber as an inspection-dedicated space by removing an alignment mechanism from the inspection chamber, thus saving the space of the inspection chamber and also allowing the alignment mechanism to be commonly used in a plurality of inspection chambers, and in turn accomplishing space saving and low cost.

The inventor of the present application variably examined an interface for inspecting a wafer including a probe card in order to use an inspection chamber as an inspection-dedicated space and obtained the knowledge that an alignment mechanism can be removed from the inspection chamber and commonly used in a plurality of inspection chambers by applying specific conception to the wafer inspection interface.

One aspect of the present disclosure relates to a wafer inspection interface for electrically connecting a tester and a wafer to inspect electrical characteristics of the wafer, comprising: a probe card having a plurality of probes electrically in contact with a plurality of electrodes of the wafer; an adsorption unit configured to adsorb the wafer to the probe card; an annular wafer adsorption sealing member with which an outer circumferential portion of the wafer adsorbed to the probe card by the adsorption unit comes in contact to form a hermetically closed space with a probe card main body; and a fixing ring configured to fix the wafer adsorption sealing member to a card holder of the probe card, wherein the adsorption unit includes an air exhaustion unit, a first air duct installed in the probe card main body such that one end portion of the first air duct is opened in the hermetically closed space and the other end portion of the first air duct is opened at a side of the fixing ring, a second air duct installed at the fixing ring such that one end portion of the second air duct is opened to face an opening of the other end portion of the first air duct and the other end portion of the second air duct is opened to be connected with the air exhaustion unit, and a hole formed on the wafer adsorption sealing member such that the opening of the other end portion of the first air duct is in communication with the opening of one end portion of the second air duct.

Another aspect of the present disclosure relates to a wafer inspection apparatus for inspecting electrical characteristics of a wafer by contacting a plurality of electrodes of a wafer with a plurality of probes of a probe card, comprising: a first wafer transfer mechanism installed at a first transfer area in order to transfer a plurality of wafers individually from a housing in which the wafers are received; an alignment mechanism configured to align the wafer, which is transferred by the first wafer transfer mechanism through a wafer retaining support from the interior of an alignment area formed on at least one end portion of the first transfer area, at an inspection position for an electrical characteristics inspection; a second wafer transfer mechanism configured to transfer the wafer through the wafer retaining support from the interior of the first transfer area and the second transfer area formed along the alignment area; and a plurality of inspection chambers arranged at an inspection area formed along the second transfer area and configured to inspect electrical characteristics of the wafer transferred by the second wafer transfer mechanism through the wafer retaining support, wherein the inspection chambers include a wafer inspection interface, and a lifting body configured to lift the wafer, and in the inspection chambers, the wafer aligned by the alignment mechanism is lifted by the lifting body and brought into contact with the plurality of probes of the wafer inspection interface to inspect electrical characteristics of the wafer.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIGS. 2A and 2B are views illustrating the wafer inspection apparatus shown in FIG. 1, wherein FIG. 2A is a front perspective view and FIG. 2B is a rear perspective view.

FIG. 3 is a conceptual view showing a major part of an alignment mechanism of the wafer inspection apparatus shown in FIG. 1.

FIGS. 7A and 7B are enlarged views of a portion of a pogo ring shown in FIG. 5, wherein FIG. 7A is a perspective view showing a major part of the pogo ring and FIG. 7B is a perspective view of a pogo block mounted in the pogo ring.

DETAILED DESCRIPTION

Hereinafter, the present disclosure will be described in detail based on embodiments shown in FIGS. 1 to 13.

Figure 1:
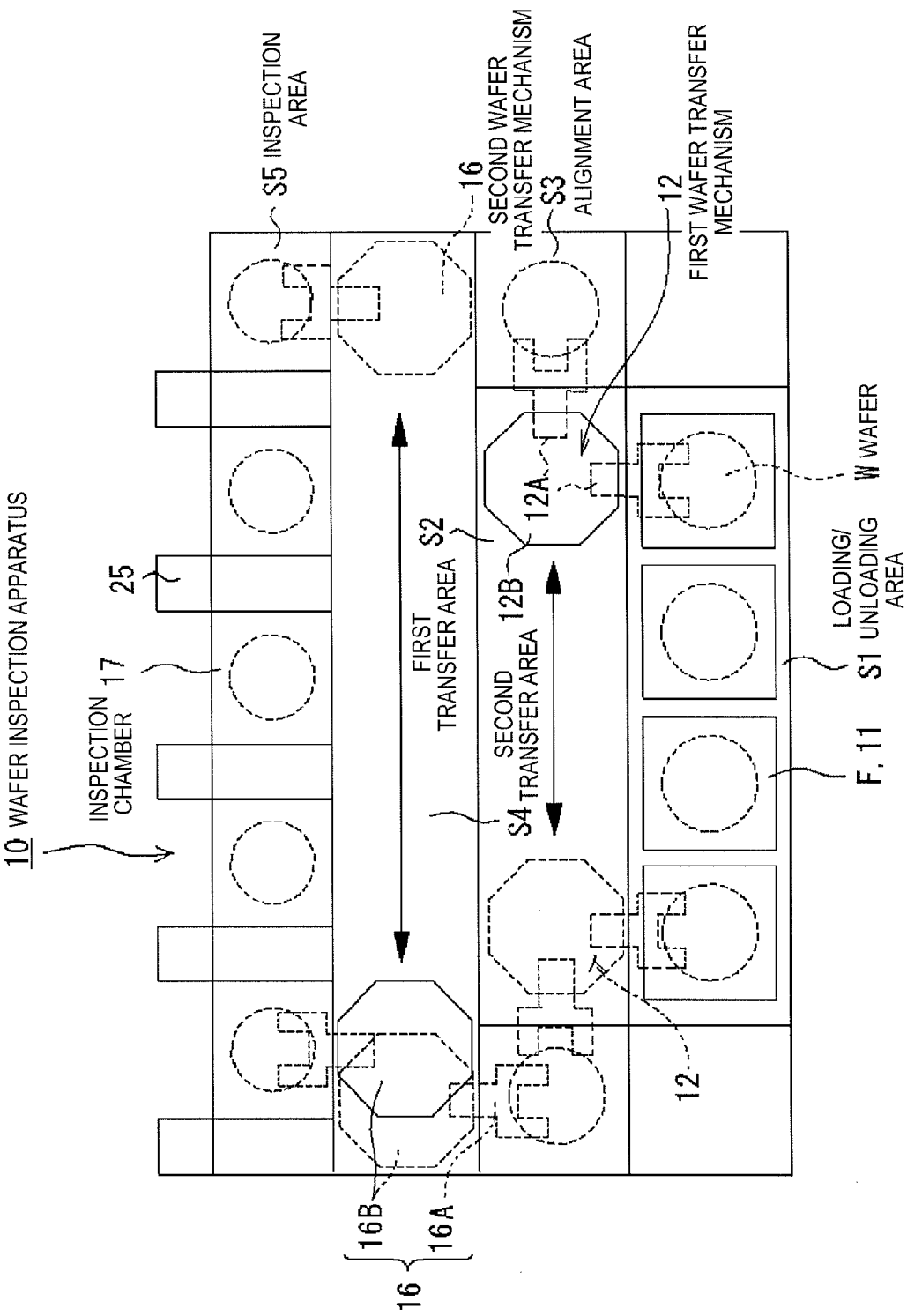
FIG. 1 is a plan view illustrating a wafer inspection apparatus according to an embodiment of the present disclosure.
Figure 2A:
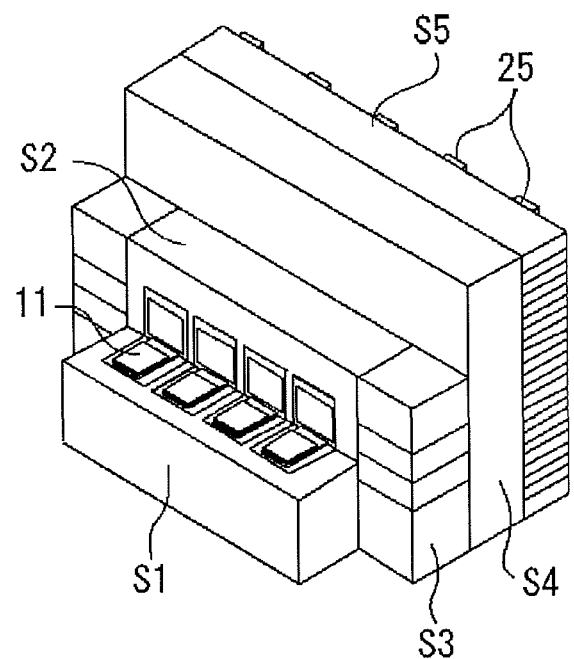
Figure 2B:
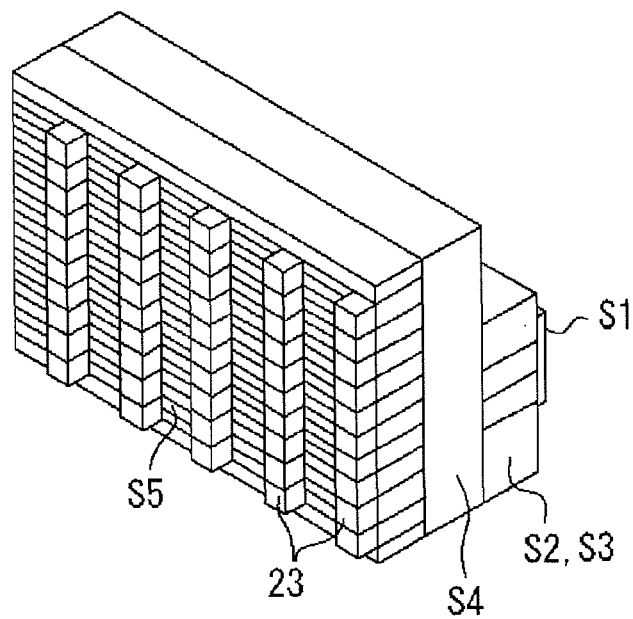

As shown in FIGS. 1, 2A and 2B, a wafer inspection apparatus 10 according to the present embodiment is divided into an loading/unloading area S1 formed to be thin and long to load and unload a wafer W by cassette, a first transfer area S2 formed to transfer the wafer W along the loading/unloading area S1, an alignment area S3 formed at both end portions of the first transfer area S2, a second transfer area S4 formed to transfer the wafer W along the first transfer area S2, and an inspection area S5 formed along the second transfer area S4 to inspect the wafer W. As shown in FIGS. 2A and 2B, the wafer inspection apparatus 10 is received in a housing. The areas S1 to S5 are formed as independent spaces. A dedicated device is installed in each of the areas S1 to S5, and the dedicated devices are controlled by a control device.

As shown in FIGS. 1, 2A and 2B, loading mechanisms 11 for loading a housing F such as FOUP or the like in which a plurality of wafers are received are installed at four positions in the loading/unloading area S1, and the loading mechanisms 11 are configured to load and fix the housing F transferred by an automatic transfer apparatus (not shown) and the like. A first wafer transfer mechanism 12 for transferring the wafer W within the housing F loaded to each of the loading mechanisms 11 is installed at the first transfer area S2 adjacent to the loading/unloading area S1. The first wafer transfer mechanism 12 is configured to transfer the wafer W within the first transfer area S2. The first wafer transfer mechanism 12 includes an arm 12A for vacuum-adsorbing the wafer W or ascending or descending in a vertical direction and simultaneously rotating in a horizontal direction to support a wafer retaining support to be described later, a body 12B having a driving mechanism installed therein to rotate and lift or lower the arm 12A, and a moving mechanism (not shown) for moving the body 12B, and is configured to move within the first transfer area S2 through the moving mechanism and transfer the wafer W.

As shown in FIGS. 1, 2A and 2B, a pre-alignment chamber (not shown) for the wafer W, an alignment chamber 13 (see FIG. 3) for the wafer W, and a buffer chamber (not shown) are installed at the alignment areas S3 formed at both end portions of the first transfer area S2, in which the pre-alignment chamber, the alignment chamber 13 and the buffer chamber are disposed vertically. A pre-alignment mechanism for performing pre-alignment on the wafer W is installed in the pre-alignment chamber, and an alignment mechanism 14 (see FIG. 3) for performing alignment on the wafer W is installed in the alignment chamber 13. Also, the buffer chamber includes a receiving mechanism for receiving the wafer W. The buffer chamber is a temporary disposition place of the wafer W after an inspection is terminated, which may also be used as a place for receiving a needle polishing wafer.

As shown in FIG. 3, the alignment mechanism 14 includes a container-like moving body 14A installed on the bottom (not shown) of the alignment chamber 13 and configured to move in a vertical direction and horizontal direction, an annular positioning member 14B surrounding the moving body 14A and fixed on the bottom of the alignment chamber 13 for positioning the wafer retaining support 15 in a certain direction, first and second cameras $14C_1$ and $14C_2$ for aligning the wafer W on the wafer retaining support 15 in cooperation with the moving body 14A, and a bridge 14D in which the first and second cameras $14C_1$ and $14C_2$ are fixed. The first and second cameras $14C_1$ and $14C_2$ capture an image of an upper face of the wafer W at each focal position (alignment height). The first camera $14C_1$ is disposed at the center of XY coordinates (the origin of XY coordinates) within the alignment chamber 13 to capture an image of the center C (see FIG. 10) of the wafer W, and the second camera $14C_2$ is disposed on a coordinate axis of XY coordinates to capture an image of a target mark T (see FIG. 10) of a circumferential portion of the wafer W. The first and second cameras $14C_1$ and $14C_2$ capture an image of the center C and the target mark T of the wafer W, respectively, and a control device obtains a line L (see FIG. 10) connecting the center C and the target mark T of the wafer based on position information thereof to obtain the slope of the line L with respect to the coordinate axis and also to correct a position deviation of the electrode of the wafer W corresponding to a plurality of probes of a pre-registered probe card.

As shown in FIG. 3, the positioning member 14B is formed as a circular annular plate member having an inner diameter greater than an outer diameter of the moving body 14A, and a plurality of (e.g., three) projections 14B$_1$ are peripherally formed on an upper surface thereof at certain intervals. The plurality of projections 14B$_1$ are disposed on the circumference with the first camera 14C$_1$ as the center and previously set at positions of respective XY coordinate values at equal distance from the origin of the XY coordinates. Further, XY coordinate values of the ends of needles of the plurality of probes of the probe card to be described later are set at the XY coordinates in the alignment chamber 13.

Further, the wafer retaining support 15 includes a retaining support plate 15A for retaining and supporting the wafer W, an annular support 15B for detachably supporting the retaining support plate 15A, and a plurality of positioning units 15C formed on a lower surface of the support 15B and having a recess portion 15C$_1$ into which each of the plurality of projections 14B$_1$ of the positioning member 14B is inserted, respectively. The wafer retaining support 15 is positioned by the positioning member 14B to be approximately horizontally supported and continually placed at a uniform position. Also, as shown in FIG. 3, the support 15B has a through hole with a large diameter compared with the moving body 14a, and the moving body 14A is formed to pass through the through hole, whereby the moving body 14A can move in a horizontal direction within the through hole.

The moving body 14A is placed immediately below a central portion of the wafer retaining support 15 supported by the positioning member 14B. The moving body 14A ascends in a vertical direction from a lower portion of the wafer retaining support 15, comes into contact with the retaining support plate 15A, and passes through the through hole of the support 15B, so as to lift the retaining support plate 15A from the support 15B up to an alignment height. In addition, the moving body 14A moves in the XYθ directions within the range of the through hole of the support 15B at the alignment height to perform alignment of the wafer W in cooperation with the first and second cameras 14C$_1$ and 14C$_2$. Also, after the alignment, the moving body 14A returns the retaining support plate 15A retaining and supporting the wafer W after the alignment onto the support 15B, while being returned to its original position. The wafer W after the alignment is transferred to the inspection area S5 along with the wafer retaining support 15, as will be described later.

As shown in FIGS. 1, 2A and 2B, a second wafer transfer mechanism 16 is installed at the second transfer area S4 adjacent to the first transfer area S2 and the alignment area S3. The second wafer transfer mechanism 16 is configured to move within the second transfer area S4 and transfer the wafer W through the wafer retaining support 15 between the alignment area S3 and the inspection area S5. Like the first wafer transfer mechanism 12, the second wafer transfer mechanism 16 includes an arm 16A, a body 16B, and a moving mechanism (not shown).

As shown in FIG. 1, a plurality of inspection chambers 17 (five chambers in this embodiment) are arranged at certain intervals along the inspection area S5 adjacent to the second transfer area S4, and the electrical characteristics of the alignment-completed wafer W transferred through the wafer retaining support 15 by the second wafer transfer mechanism 16 are inspected in the inspection chambers 17. Also, as shown in FIGS. 2A and 2B, the inspection chambers 17 are formed to have a stacked structure in which a plurality of the inspection chambers 17 are stacked in a vertical direction in each arrangement position of the inspection area S5. The inspection chamber 17 of the respective level has the same structure. Thus, one inspection chamber 17 will be described as an example with reference to FIG. 4 hereinafter.

Figure 4:
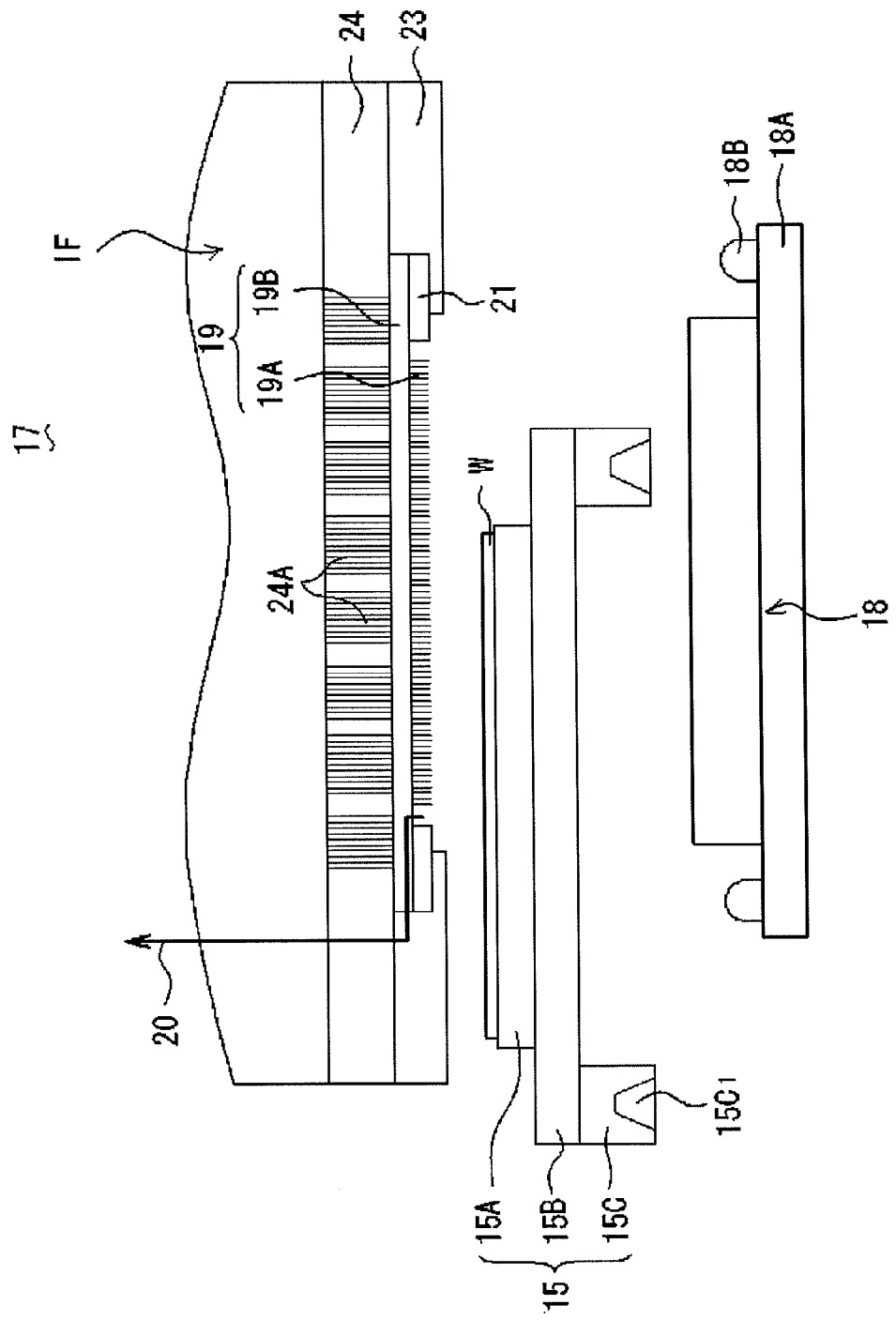
FIG. 4 is a conceptual view showing a major part of an inspection chamber of the wafer inspection apparatus shown in FIG. 1.

As shown in FIG. 4, the inspection chamber 17 includes a wafer inspection interface (hereinafter referred to "inspection interface") IF for electrically connecting a tester and the wafer W, and a lifting body 18 for lifting or lowering the wafer W to allow the wafer W to be separated from or come into contact with the interface IF, and as described below, when the wafer is inspected, the wafer W is electrically connected with the interface IF through the lifting body 18.

As shown in FIG. 4, the interface IF includes a probe card 19 having a plurality of probes 19A fixed to a head plate and corresponding to a plurality of electrodes of the wafer W, an adsorption unit 20 for adsorbing the wafer W to the probe card 19, an annular wafer adsorption sealing member 21 with which an outer circumferential portion of the wafer W adsorbed to the probe card 19 by the adsorption unit 20 comes in contact to form a hermitically closed space with a probe card main body 19B, a fixing ring 23 for fixing the wafer adsorption sealing member 21 to a card holder 22 (see FIGS. 5 and 6) for retaining and supporting the probe card 19, and a disk-like pogo ring 24 connected to a plurality of terminal electrodes formed on an upper surface of the probe card 19.

Now, the structure of the interface IF according to the present embodiment will be described in detail with reference to FIGS. 5 to 7.

Figure 5:
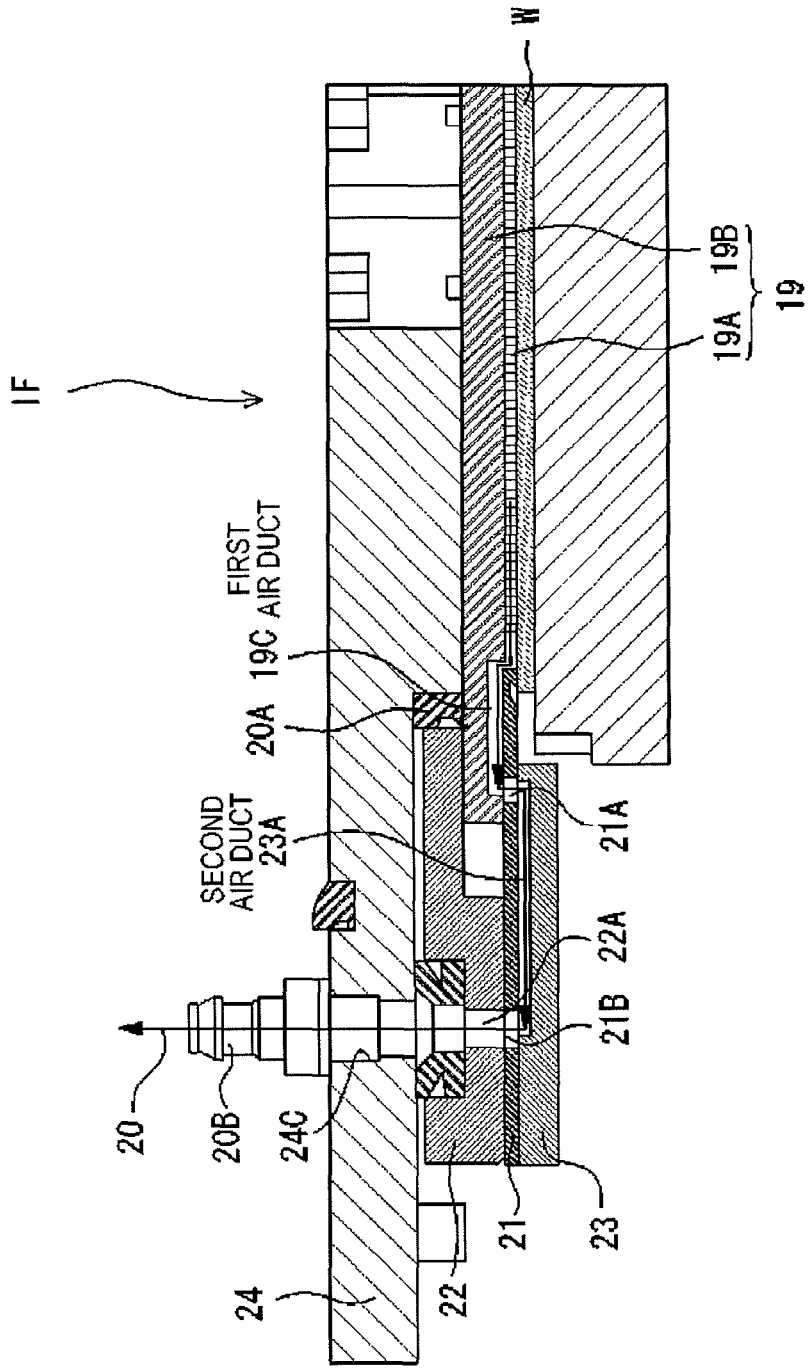
FIG. 5 is a sectional view showing a major part of a wafer inspection interface applied to the inspection chamber shown in FIG. 4 according to an embodiment of the present disclosure.
Figure 6:
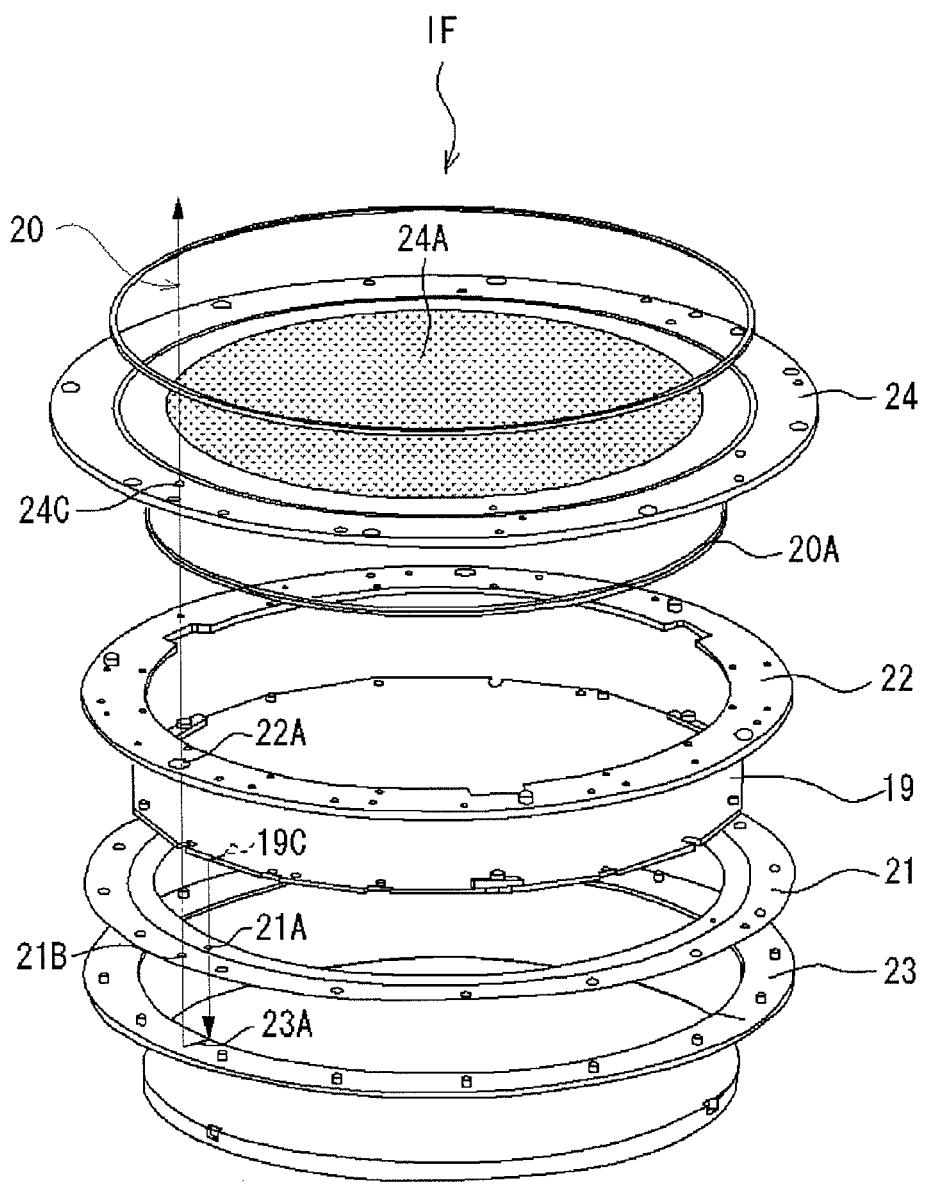
FIG. 6 is an exploded perspective view of the wafer inspection interface shown in FIG. 5.

As shown in FIGS. 5 and 6, an outer circumferential portion of the probe card main body 19B is retained and supported by the annular card holder 22. An outer circumferential portion of the card holder 22 is formed as a thick portion thicker than an inner side of the card holder 22, and the inner diameter of the thick portion is larger than an outer diameter of the probe card main body 19B. An inner diameter of a thin portion of the card holder 22 is smaller than the outer diameter of the probe card main body 19B, and an outer diameter of the thin portion is smaller than the outer diameter of the pogo ring 24. The sum of the thickness of the probe card main body 19B and the thickness of the thin portion of the card holder 22 is substantially equal to the thickness of the thick portion of the card holder 22.

As shown in FIGS. 5 and 6, an outer diameter of the wafer adsorption sealing member 21 is substantially equal to the outer diameter of the card holder 22, and an inner diameter of the wafer adsorption sealing member 21 is smaller than the outer diameter of the probe card main body 19B and has a size that surrounds the plurality of probes 19A. A gap is formed between the inner diameter of the wafer adsorption sealing member 21 and the plurality of probes 19A.

As shown in FIGS. 5 and 6, an outer diameter of the fixing ring 23 is substantially equal to the outer diameter of the wafer adsorption sealing member 21, and an inner diameter of the fixing ring 23 is smaller than the outer diameter of the probe card main body 19B and larger than the inner diameter of the wafer adsorption sealing member 21. The wafer adsorption sealing member 21 and the outer circumferential portion of the probe card main body 19B overlap each other on the inner circumferential portion of the fixing ring 23.

Figure 7A:
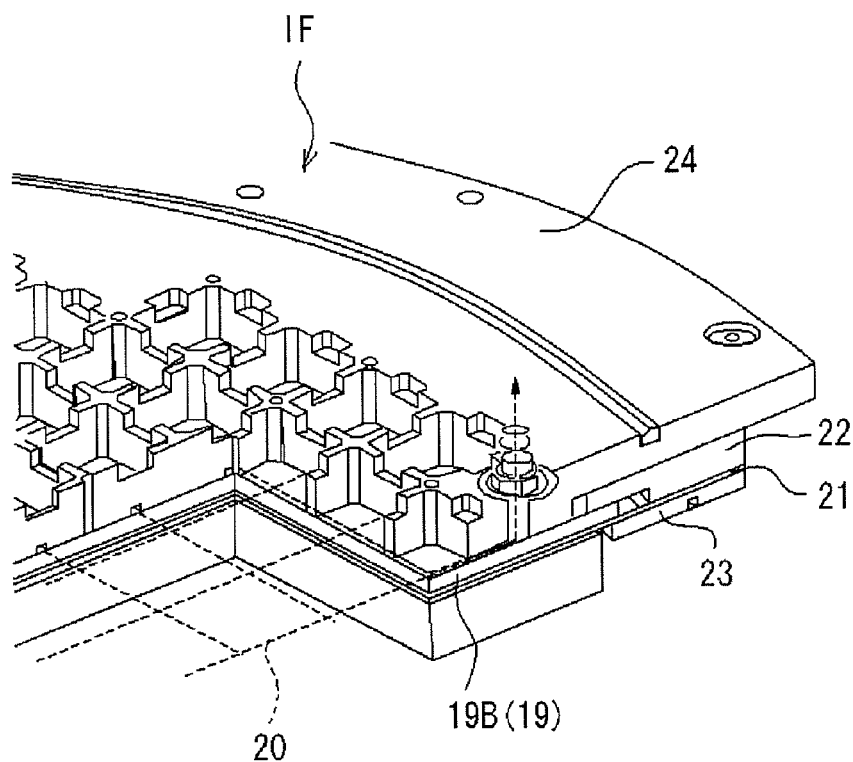
Figure 7B:
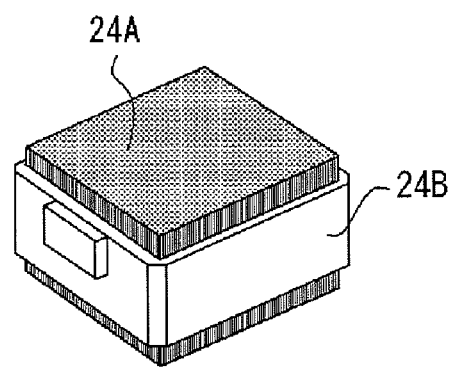

As shown in FIGS. 5 and 6, an outer diameter of the pogo ring 24 is larger than the outer diameter of the card holder 22, and has a thick portion formed to have a diameter smaller than the inner diameter of the card holder 22. A sealing member 20A is mounted between the inner circumferential surface of the card holder 22 and the thick portion of the pogo ring 24 to prevent the positions of the center of axis of the probe card 19 and the center of axis of the pogo ring 24 from being deviated. Also, as indicated by dotted lines in FIG. 7A, the pogo ring 24 has a plurality of pogo pins 24A disposed throughout the entirety of the thick portion. Further, as shown in FIG. 7A, the thick portion includes a plurality of through holes divided by a separation wall of a rectangular shape in a plane view. A pogo block 24B shown in FIG. 7B is mounted at each of the through holes. The plurality of pogo pins 24A are grouped by a rectangular frame so as to be integrated into the pogo block 24B. Also, the through holes shown in FIG. 7A are smaller than the pogo block 24B illustrated in FIG. 7B.

The adsorption unit 20 for adsorbing the wafer W to the probe card 19 will now be described. As shown in FIGS. 5 and 6, the adsorption unit 20 includes an exhaustion unit (e.g., a vacuum pump; not shown), a first air duct 19C installed at the outer circumferential portion of the probe card main body 19B, a second air duct 23A installed on the fixing ring 23, and a hole 21A formed at the wafer adsorption sealing member 21 such that the first air duct 19C is in communication with the second air duct 23A.

As shown in FIGS. 5 and 6, the first air duct 19C is formed as a recess in a radial direction on a lower surface of the probe card main body 19B, and the recess is covered at the inner circumferential portion of the wafer adsorption sealing member 21 so as to be formed as an air duct. One end portion (right end portion) of the first air duct 19C is protruded from an inner circumferential portion of the wafer adsorption sealing member 21 so as to be open to a lower side of the probe card main body 19B, and the other end (left end portion) of the first air duct 19C is positioned in the vicinity of the inner circumferential portion of the fixing ring 23.

As shown in FIGS. 5 and 6, the second air duct 23A is formed as a recess in a radial direction on an upper surface of the fixing ring 23, and the recess is covered by the wafer adsorption sealing member 21 so as to be formed as an air duct. One end portion (right end portion) of the second air duct 23A is positioned slightly closer to the axial center of the fixing ring 23 than the outer circumferential surface of the probe card main body 19B, and the other end portion (left end portion) of the second air duct 23A is positioned at a thick portion of the card holder 22. The second air duct 23A is formed to overlap with an extension line toward the left of the first air duct 19C, and the left end portion of the first air duct 19C and the right end portion of the second air duct 23A are positioned to overlap with each other. The hole 21A of the wafer adsorption sealing member 21 is formed at the portion where the first and second air ducts 19C and 23A overlap, and the first and second air ducts 19C and 23A communicate with each other through the hole 21A. Also, through holes 21B, 22A, and 24C are formed at a portion where the wafer adsorption sealing member 21, the card holder 22, and the pogo ring 24 overlap one another, and the connection member 20B to the vacuum pump is mounted in the through holes.

Thus, an exhaustion passage by the vacuum pump is formed by the first air duct 19C of the probe card main body 19B, the hole 21A of the wafer adsorption sealing member 21, the second air duct 23A of the fixing ring 23, and the through hole 21B of the wafer adsorption sealing member 21, and air is exhausted by the vacuum pump from the hermetically closed space formed by the wafer W, the probe card 19 and the wafer adsorption sealing member 21 as indicated by the arrows in FIGS. 5 and 6, thereby vacuum-adsorbing the wafer W to the wafer adsorption sealing member 21.

As described above, in order to adsorb the wafer W to the wafer adsorption sealing member 21, as shown in FIG. 4, the lifting body 18 disposed immediately below the interface IF is used. As shown in FIG. 4, a flange portion 18A is formed at a lower end portion of the lifting body 18, and a plurality of projections 18B, which fit to the recess portion $15C_1$ of the positioning unit 15C of the wafer retaining support 15, are formed at certain intervals in a peripheral direction on an upper face of the flange portion 18A. These projections 18B are disposed at positions of the same XY coordinates corresponding to the plurality of projections $14B_1$ formed on the positioning member 14B within the alignment chamber 13. Namely, the XY coordinates in the inspection chamber 17 and the XY coordinates in the alignment chamber 13 are in a mirror image relationship, whereby the plurality of electrodes of the wafer W on the retaining support plate 15A aligned in the alignment chamber 13 are reliably brought into contact with the plurality of probes 19A of the probe card 19 positioned immediately above them. Also, the flange portion 18A and the plurality of projections 18B of the lifting body 18 correspond to the positioning member 14B within the alignment chamber 13.

The lifting body 18 lifts the wafer retaining support 15 supported by the plurality of projections 18B of the flange portion 18A immediately upwardly toward the probe card 19 to allow the outer circumferential portion of the wafer W to be brought into contact with the wafer adsorption sealing member 21 to form a hermetically closed space. The vacuum pump vacuum-adsorbs the hermetically closed space to vacuum-adsorb the wafer W to the wafer adsorption sealing member 21. Also, the lifting body 18 is driven to leave the wafer W after the vacuum adsorption at the probe card 19 side and to lower the lifting body 18 to separate the wafer retaining support 15 from the wafer W, and lift the lifting body 18 again to allow the wafer W and the plurality of probes to be in pressure-contact. After the inspection, the inspection-completed wafer W reverts back through the reverse path so as to be unloaded through the wafer retaining support 15 from the inspection chamber 17.

As such, since the interface IF is installed in the space of the inspection chamber 17 according to the present embodiment, the space for inspecting the wafer W can be sufficiently secured if there are the minimum space in which the wafer retaining support 15 is loaded and unloaded and the minimum space in which the lifting body 18 is lifted or lowered to allow the wafer W retained and supported by the wafer retaining support 15 to be brought into contact with the probe card 19. Accordingly, the height of the inspection chamber 17 can be remarkably lowered compared with the conventional technologies, as described above, so the installation space of the inspection chamber can be significantly reduced by employing the stacked structure. Also, since the lifting body 18 does not need to move in the XY direction, the occupancy area of the inspection chamber 17 can also be significantly reduced. Moreover, since the alignment mechanism 14 can be shared in the respective inspection chambers 17, there is no need to install the high-priced alignment mechanism 14 in each of the inspection chambers 17 as in the conventional technologies and thus the cost can be considerably reduced.

Also, as shown in FIGS. 1, 2A and 2B, a cooling duct 25 is installed in each of the inspection chambers 17 to cool the wafer W heated during the inspection through each cooling device (not shown) to constantly maintain a uniform temperature.

Now, the operation will be described with reference to FIGS. 8 to 13.

First, the housing F such as FOUP or the like is loaded on each loading mechanism 11 of the loading/unloading area S1 by an automatic transfer device. The first wafer transfer mechanism 12 is driven at the first transfer area S2 to unload the wafers W individually from the housing F through the arm 12A and transfer the wafers W to the pre-alignment mechanism within the pre-alignment chamber of the alignment area S3. Then, the wafer W is pre-aligned therein. Thereafter, the first wafer transfer mechanism 12 unloads the wafer W from the pre-alignment chamber through the arm 12A and transfers the wafer W along with the wafer retaining support 15 to the alignment chamber 13 through the arm 12A.

Figure 8A:
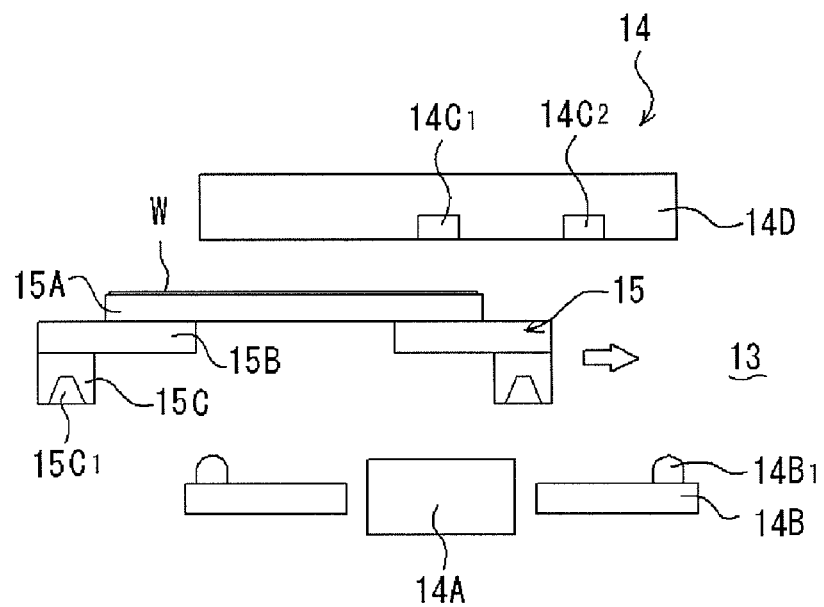
FIGS. 8A and 8B are views showing an aligning process using the alignment mechanism shown in FIG. 3.
Figure 8B:
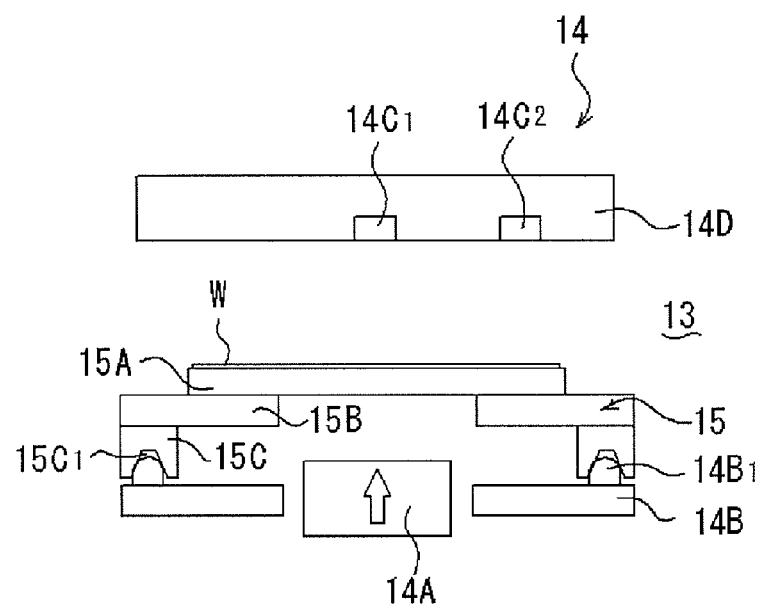

Next, as shown in FIG. 8A, the first wafer transfer mechanism 12 transfers the wafer W into the alignment chamber 13 through the wafer retaining support 15, and as shown in FIG. 8B, the first wafer transfer mechanism 12 delivers the wafer retaining support 15 to the positioning unit 15C. At this time, the recess portion $15C_1$ of the positioning unit 15C of the wafer retaining support 15 is fit to the projection $14B_1$ of the positioning member 14B, whereby the position of the wafer retaining support 15 is automatically determined in the alignment chamber 13. After the position is determined, as indicated by the arrow in FIG. 8B, the moving body 14A ascends.

Figure 9A:
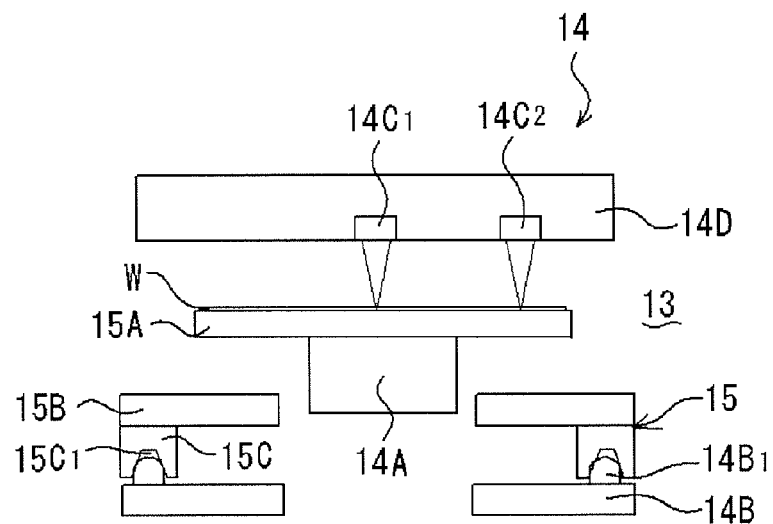
FIGS. 9A and 9B are views showing the aligning process using the alignment mechanism shown in FIG. 3, which follows the process shown in FIG. 8.
Figure 9B:
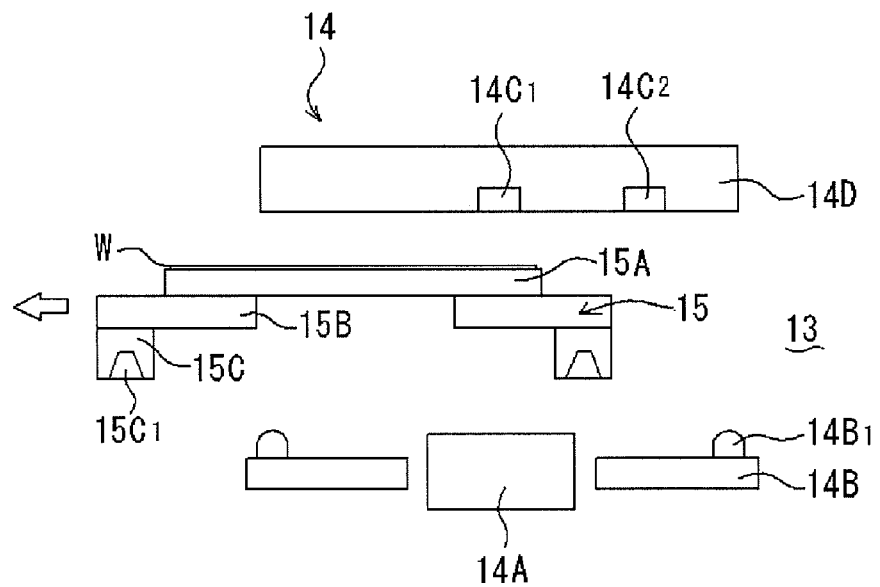
Figure 10:
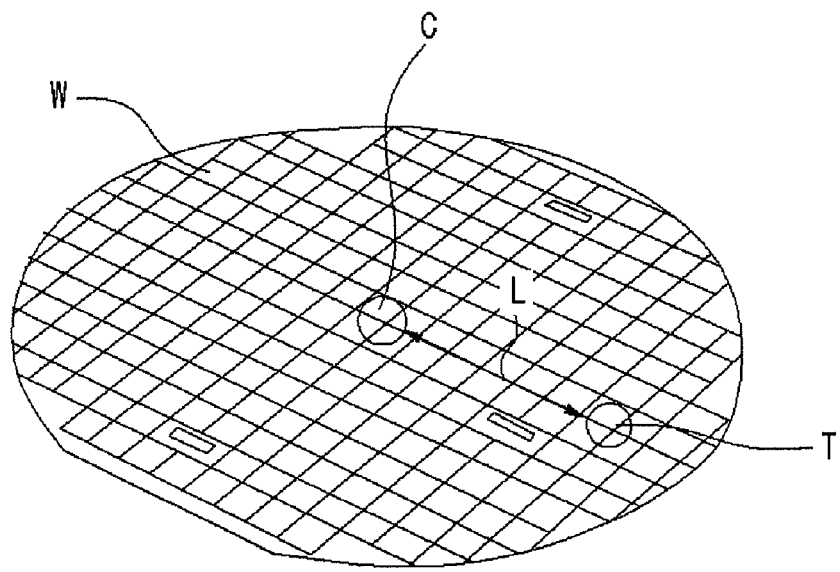
FIG. 10 is a perspective view of a wafer in the aligning process using the alignment mechanism shown in FIG. 3.

The moving body 14A ascends to come into contact with the retaining support plate 15A, and as shown in FIG. 9A, the moving body 14A ascends up to the alignment height and is stopped. At this position, the first and second cameras $14C_1$ and $14C_2$ are operated under the control of the control device. Namely, as shown in FIG. 10, the first camera $14C_1$ captures an image of the wafer to recognize the center C of the wafer W. When the first camera $14C_1$ cannot recognize the center C of the wafer W, while moving in the XY direction within the range of the through hole of the support 15B of the wafer retaining support 15, the first camera $14C_1$ finds the center C of the wafer W to recognize the center C. Subsequently, the second camera $14C_2$ captures an image of the target T of the circumferential portion of the wafer W to recognize the slope in the θ direction of the wafer W from the line L connecting the center C and the target T, and the coordinate axis. When the second camera $14C_2$ recognizes the slope of the wafer W, the moving body 14A rotates in the θ direction to correct the slope of the wafer W. Subsequently, the first camera $14C_1$ again checks the center of the wafer W and recognizes the center C of the wafer W. After such sequential operations, the alignment of the wafer W is terminated.

After the alignment, the moving body 14A descends to its original position, and the retaining support plate 15A is loaded on the support 15B during the descent. Thereafter, the second wafer transfer mechanism 16 is driven at the second transfer area S4 to transfer the wafer W along with the wafer retaining support 15 from the alignment chamber 13 to the inspection chamber 17 of the inspection area S5 as indicated by the arrow in FIG. 9B.

Figure 11A:
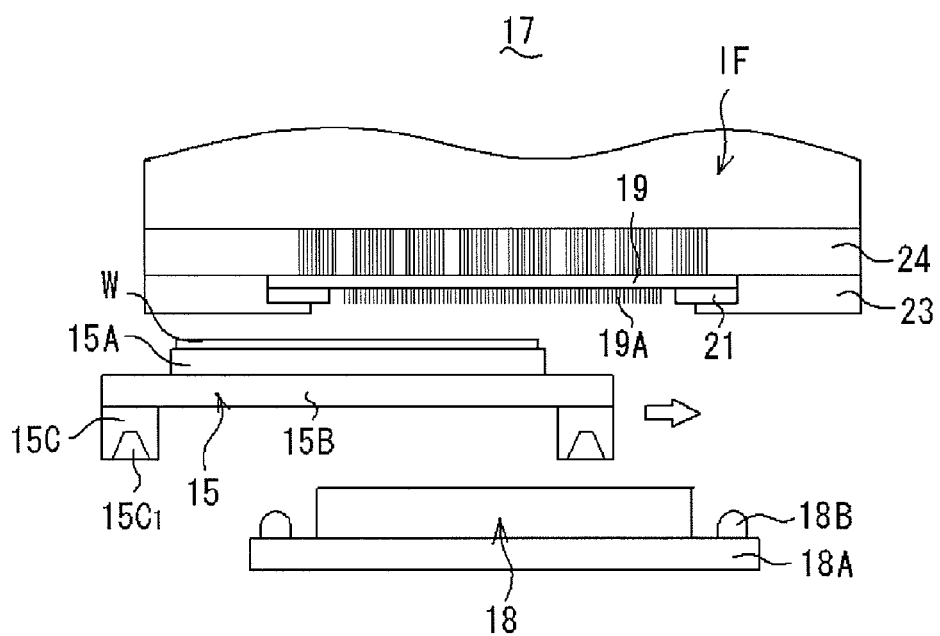
FIGS. 11A and 11B are views showing an inspecting process in an inspection chamber shown in FIG. 4.
Figure 11B:
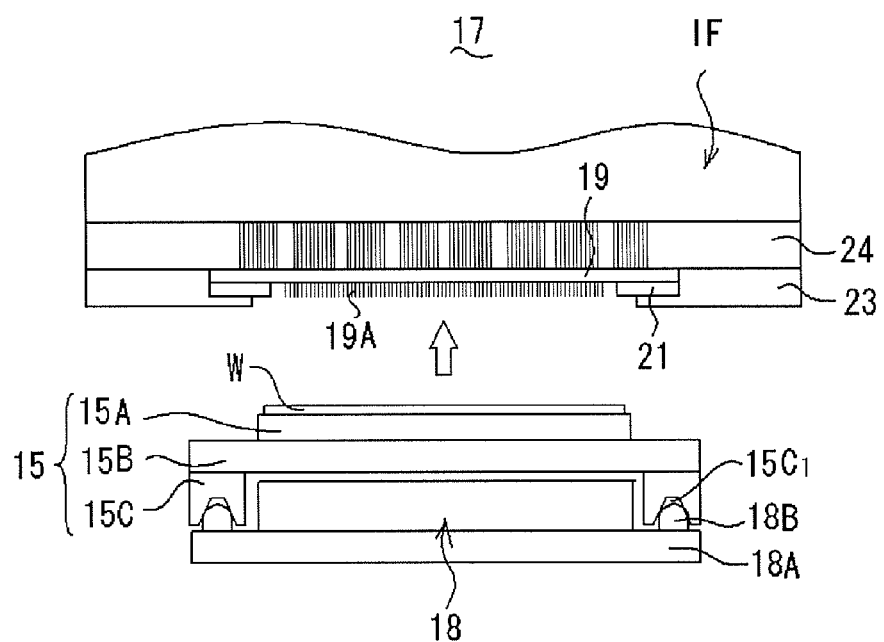

As shown in FIG. 11A, the second wafer transfer mechanism 16 transfers the wafer retaining support 15 into a certain inspection chamber 17 at the inspection area S5, and as shown in FIG. 11B, the second wafer transfer mechanism 16 delivers the wafer retaining support 15 to the lifting body 18. At this time, the plurality of recess portions $15C_1$ of the positioning unit 15C of the wafer retaining support 15 are fitted to the plurality of projections 18B of the lifting body 18, whereby the position of the wafer retaining support 15 is automatically determined in the inspection chamber 17 to maintain the alignment state in the alignment chamber 13. As indicated by the arrow in FIG. 11B, the lifting body 18 ascends in a vertical direction from the alignment position until it is elastically brought into contact with the sealing member 21 in a state of supporting the wafer retaining support 15.

Figure 12A:
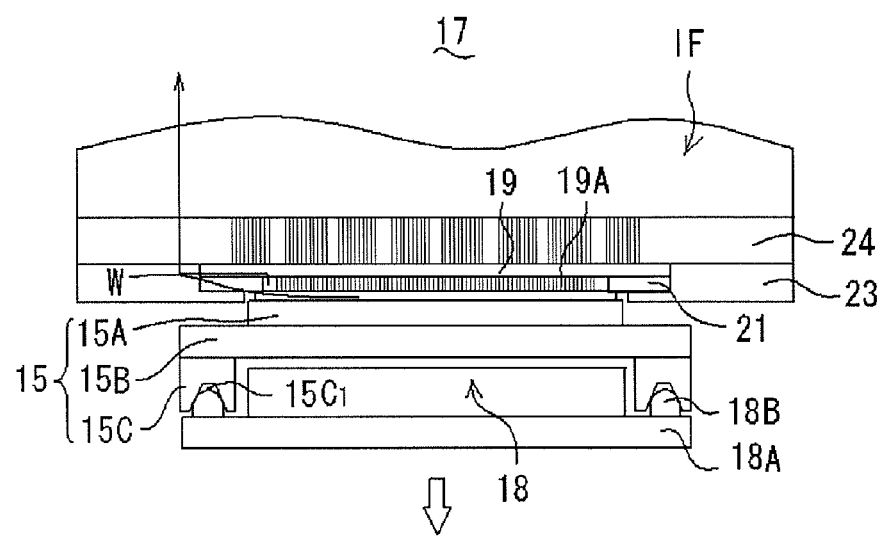
FIGS. 12A and 12B are views showing the inspecting process in the inspection chamber shown in FIG. 4, which follows the process shown in FIG. 11.
Figure 12B:
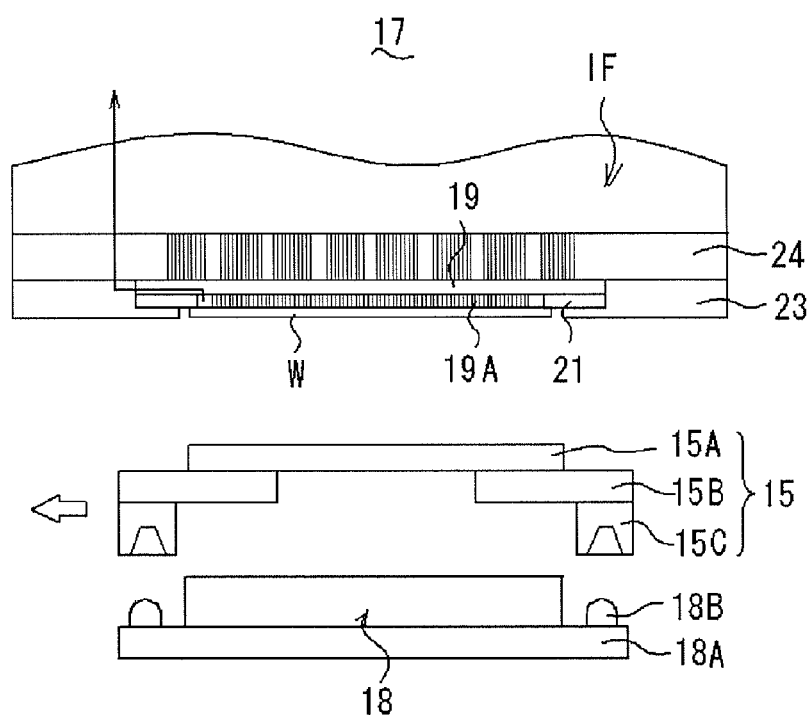

When the lifting body 18 ascends, as shown in FIG. 12A, the circumferential portion of the wafer W comes into contact with the wafer adsorption sealing member 21, and a hermetically closed space is formed by the wafer W, the wafer adsorption sealing member 21, and the probe card 19. Here, the vacuum pump of the adsorption unit 20 is operated to exhaust air within the hermetically closed space from the air exhaust passage formed by the first air duct 19C, the hole 21A of the wafer adsorption sealing member 21, the second air duct 23A of the fixing ring 23, and the through hole 21A of the wafer adsorption sealing member, as indicated by the arrow in FIG. 12A, to vacuum-adsorb the wafer W to the wafer adsorption sealing member 21. When the wafer W is vacuum-adsorbed to the wafer adsorption sealing member 21, the lifting body 18 descends to its original position in a state of supporting the wafer retaining support 15, as indicated by the white arrow in FIG. 12A. In the interim, the second wafer transfer mechanism 16 separates the wafer retaining support 15 from the lifting body 18 and brings it out of the inspection chamber 17, as indicated by the white arrow in FIG. 12B.

Figure 13A:
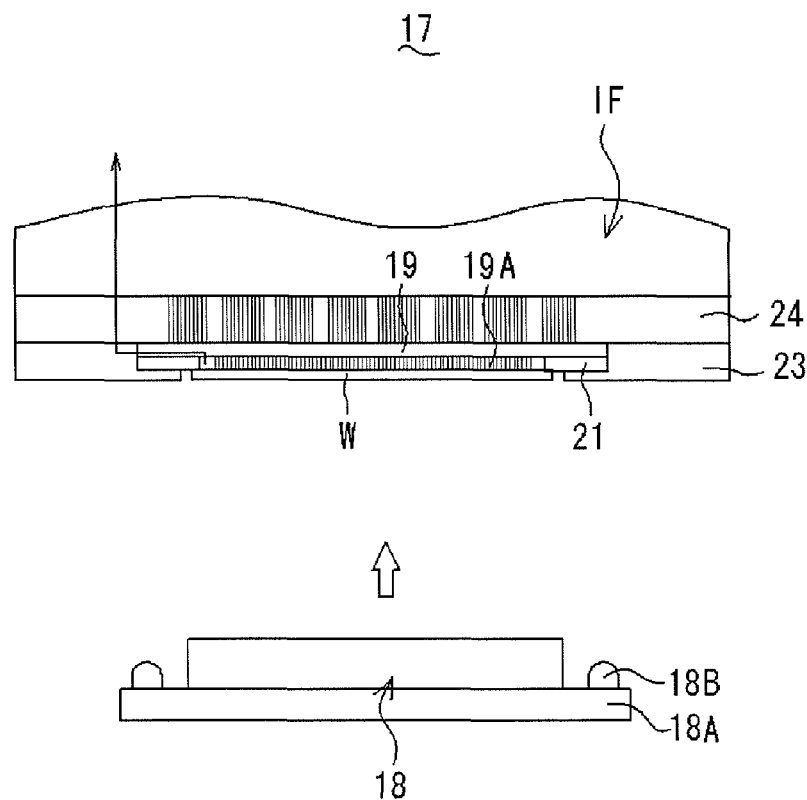
FIGS. 13A and 13B are views showing the inspecting process in the inspection chamber shown in FIG. 4, which follows the process shown in FIG. 12.
Figure 13B:
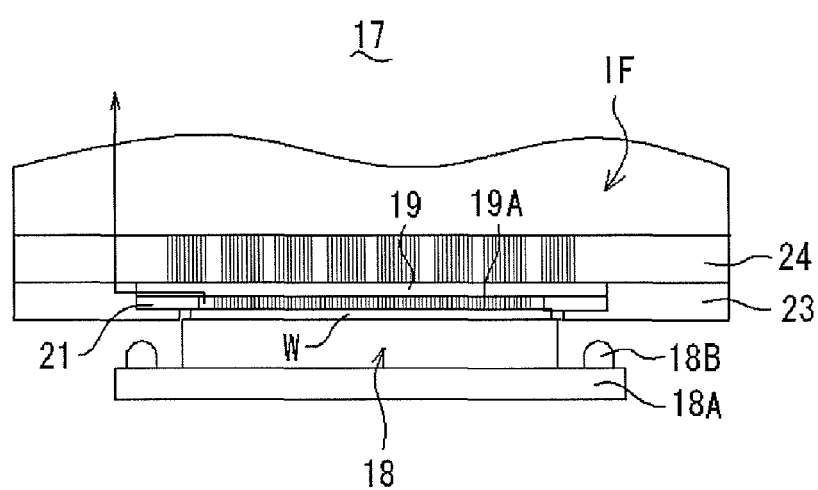

When the wafer retaining support 15 is unloaded from the inspection chamber 17, the lifting body 18 again ascends in the vertical direction, as indicated by the white arrow in FIG. 13A, and as shown in FIG. 13B, the lifting body 18 presses the wafer W vacuum-adsorbed to the probe card 19 to allow the plurality of electrodes of the wafer W and the plurality of probes 19A of the probe card 19 to be collectively brought into contact electrically. In the state that the wafer W and the probe card 19 are in electrical contact, the electrical characteristics of the wafer W are inspected.

When the inspection is terminated, the lifting body 18 is lowered and returned to its original position. In the interim, the second wafer transfer mechanism 16 loads the wafer retaining support 15 into the inspection chamber 17 and delivers the wafer retaining support 15 to the lifting body 18, and then the second wafer transfer mechanism 16 exits the inspection chamber 17. Meanwhile, the lifting body 18 ascends along with the wafer retaining support 15 to allow the retaining support plate 15A to be brought into contact with the inspection-completed wafer W. At this time, while the lifting body 18 is returned to its original position after stopping the vacuum-adsorption through the vacuum pump and returning the hermetically closed space to a normal pressure, the second wafer transfer mechanism 16 receives the wafer retaining support 15 from the lifting body 18, exits the inspection chamber 17, and returns the wafer retaining support 15 to the buffer chamber. Subsequently, the first wafer transfer mechanism 12 is driven to return the wafer W from the wafer retaining support 15 into the housing F of the loading mechanism 11. Through such sequential operations, the inspection of the wafer W is terminated. Other wafers are each transferred to the plurality of inspection chambers 17 at the inspection area S5 from the housing F and are similarly inspected.

As described above, according to the present embodiment, since the interface IF is installed in the inspection chamber 17, the alignment mechanism 14 can be removed from the inspection chamber 17, and the inspection chamber 17 can be used exclusively as a space for inspection. Thus, the space of the inspection chamber 17 can be saved and the alignment mechanism 14 can be commonly used by the plurality of inspection chambers 17.

Also, according to the present embodiment, the housing F is loaded at the loading/unloading area S1, and by using the first and second wafer transfer mechanism 12 and 16 respectively installed at the first and second transfer areas S2 and S4, the wafer W aligned by the alignment mechanism 14 of the alignment area S3 is transferred to the inspection chamber 17 installed at the inspection area S5 by the wafer retaining support 15. Further, the plurality of probes 19A of the interface IF and the plurality of electrodes of the wafer W are electrically brought into contact to inspect the electrical characteristics of the wafer W in the inspection chamber 17 without a need to align the wafer W retained and supported by the wafer retaining support 15. Thus, the installation space of the wafer inspection apparatus 10 can be drastically reduced, and also, the installation cost can be remarkably reduced.

In addition, according to the present embodiment, since the electrical characteristics of the wafer W can be inspected by simply lifting the wafer W in the inspection chamber 17 and the inspection chambers 17 having the multi-layered structure can be provided at a plurality of places in the inspection area S5, inspection efficiency can be significantly enhanced.

The present disclosure is not limited to the foregoing embodiments, and the design of the components may be modified as necessary. Also, the wafer inspection apparatus according to the present disclosure can be applicable to a burn-in inspection apparatus in terms of its structure.

According to the present disclosure, the wafer inspection interface and the wafer inspection apparatus, in which the alignment mechanism is removed from the inspection chamber to use the inspection chamber as an inspection-dedicated space to thus save the space of the inspection chamber and commonly use the alignment mechanism by a plurality of inspection chambers, can be provided.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A wafer inspection interface for electrically connecting a tester and a wafer to inspect electrical characteristics of the wafer, comprising:
a probe card having a plurality of probes electrically in contact with a plurality of electrodes of the wafer;
an adsorption unit configured to adsorb the wafer to the probe card;
an annular wafer adsorption sealing member with which an outer circumferential portion of the wafer adsorbed to the probe card by the adsorption unit comes in contact to form a hermetically closed space, the hermetically closed space being formed by the wafer, the annular wafer adsorption sealing member and the probe card when the outer circumferential portion of the wafer is in contact with an inner circumferential portion of the annular wafer adsorption sealing member; and
a fixing ring configured to fix the wafer adsorption sealing member to a card holder of the probe card,
wherein the adsorption unit includes an air exhaustion unit, a first air duct installed and extending radially in a probe card main body such that one end portion of the first air duct is opened in the hermetically closed space and the other end portion of the first air duct is opened at a side of the fixing ring, a second air duct installed and extending radially in the fixing ring such that one end portion of the second air duct is opened to face an opening of the other end portion of the first air duct and the other end portion of the second air duct is opened to be connected with the air exhaustion unit, and a hole formed on the wafer adsorption sealing member such that the opening of the other end portion of the first air duct is in communication with the opening of one end portion of the second air duct via the hole.

2. The wafer inspection interface of claim 1, further comprising a disk-type connector having a plurality of elastic connection members electrically connected with a plurality of terminal electrodes formed on a lower surface of the probe card.

3. The wafer inspection interface of claim 2, wherein the elastic connection members are formed as pogo pins, and the connector is formed as a pogo ring.

4. The wafer inspection interface of claim 3, wherein a separation wall is formed at an inner side of the pogo ring to form a plurality of through holes, and a pogo block including a plurality of pogo pins is mounted on the plurality of through holes.

5. A wafer inspection apparatus for inspecting electrical characteristics of a wafer by contacting a plurality of electrodes of a wafer with a plurality of probes of a probe card, comprising:
a first wafer transfer mechanism installed at a first transfer area in order to transfer a plurality of wafers individually from a housing in which the wafers are received;
an alignment mechanism configured to align the wafer, which is transferred by the first wafer transfer mechanism through a wafer retaining support from the interior of an alignment area formed on at least one end portion of the first transfer area, at an inspection position for an electrical characteristics inspection;
a second wafer transfer mechanism configured to transfer the wafer through the wafer retaining support from the interior of the first transfer area and the second transfer area formed along the alignment area; and
a plurality of inspection chambers arranged at an inspection area formed along the second transfer area and configured to inspect electrical characteristics of the wafer transferred by the second wafer transfer mechanism through the wafer retaining support,
wherein the inspection chambers include a wafer inspection interface for electrically connecting a tester and the wafer to inspect electrical characteristics of the wafer, and a lifting body configured to lift the wafer, and in the inspection chambers, the wafer aligned by the alignment mechanism is lifted by the lifting body and brought into contact with the plurality of probes of the wafer inspection interface to inspect electrical characteristics of the wafer, and
wherein the wafer inspection interface includes:
the probe card having a plurality of probes electrically in contact with a plurality of electrodes of the wafer;
an adsorption unit configured to adsorb the wafer to the probe card;
an annular wafer adsorption sealing member with which an outer circumferential portion of the wafer adsorbed to the probe card by the adsorption unit comes in contact to form a hermetically closed space, the hermetically closed space being formed by the wafer, the annular wafer adsorption sealing member and the probe card when the outer circumferential portion of the wafer is in contact with an inner circumferential portion of the annular wafer adsorption sealing member; and
a fixing ring configured to fix the wafer adsorption sealing member to a card holder of the probe card,
wherein the adsorption unit includes an air exhaustion unit, a first air duct installed and extending radially in a probe card main body such that one end portion of the first air duct is opened in the hermetically closed space and the other end portion of the first air duct is opened at a side of the fixing ring, a second air duct installed and extending radially in the fixing ring such that one end portion of the second air duct is opened to face an opening of the other end portion of the first air duct and the other end portion of the second air duct is opened to be connected with the air exhaustion unit, and a hole formed on the wafer adsorption sealing member such that the opening of the other end portion of the first air duct is in communication with the opening of one end portion of the second air duct via the hole.

6. The wafer inspection apparatus of claim 5, wherein the alignment mechanism and the inspection chamber include a positioning member configured to receive the wafer retaining support at a position set based on the same position relationship respectively therein.

7. The wafer inspection apparatus of claim 6, wherein the wafer retaining support includes a retaining support plate configured to retain and support the wafer and a support configured to detachably support the retaining support plate, and a plurality of positioning units, which are combined with the respective positioning members, are installed on a lower surface of the support.

8. The wafer inspection apparatus of claim 7, wherein the alignment mechanism includes a moving body configured to lift the retaining support plate from the support and horizontally move the retaining support plate, and an image capturing unit configured to align the wafer retained and supported by the retaining support plate in cooperation with the moving body.

9. The wafer inspection apparatus of claim 6, wherein the positioning member is integrated with the lifting body.

10. The wafer inspection apparatus of claim 5, wherein a plurality of inspection chambers are stacked in a vertical direction at respective arrangement positions in the inspection area.

11. The wafer inspection apparatus of claim 5, wherein a buffer chamber for receiving the wafer retaining support is installed at the alignment area.

* * * * *